(12) United States Patent
Lee

(10) Patent No.: US 8,089,079 B2
(45) Date of Patent: Jan. 3, 2012

(54) LIGHT EMITTING DEVICE

(75) Inventor: Kwang Cheol Lee, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 628 days.

(21) Appl. No.: 12/145,252

(22) Filed: Jun. 24, 2008

(65) Prior Publication Data

US 2009/0001392 A1    Jan. 1, 2009

(30) Foreign Application Priority Data

Jun. 26, 2007 (KR) .................. 10-2007-0062914

(51) Int. Cl.
*H01L 29/20* (2006.01)
*H01L 33/00* (2010.01)

(52) U.S. Cl. .......... 257/89; 257/88; 257/99; 257/100; 257/E33.056; 257/E33.061; 257/E33.066; 313/483; 313/485; 313/491; 313/494; 313/498; 313/500; 313/512; 362/217.08; 362/217.1; 362/217.11; 362/231; 362/267; 362/310; 362/356; 362/364; 362/800

(58) Field of Classification Search ............. 257/88, 257/89, 99, 100, E33.056–E33.061, E33.066; 313/483, 485, 491–494, 498, 500, 512; 362/217.08, 362/217.1, 217.11, 231, 356, 364, 555, 611–614, 362/630, 632, 633, 800, 267, 310
See application file for complete search history.

(56) References Cited

U.S. PATENT DOCUMENTS

| 6,267,515 B1* | 7/2001 | Okuda et al. ............ 385/88 |
| 2004/0000674 A1* | 1/2004 | Tomioka et al. ............ 257/88 |
| 2005/0087747 A1* | 4/2005 | Yamada et al. ............ 257/80 |
| 2006/0245188 A1* | 11/2006 | Takenaka ............ 362/231 |

FOREIGN PATENT DOCUMENTS

KR    1020080027601    *    2/2008

* cited by examiner

*Primary Examiner* — Meiya Li
(74) *Attorney, Agent, or Firm* — Birch, Stewart, Kolasch & Birch, LLP

(57) ABSTRACT

A light emitting device includes a package body including a multilayer cavity; a first light emitting part including a first light emitting device in a first cavity of a first layer area of the multilayer cavity, and a second light emitting part including a second light emitting device in a second cavity of a second layer area higher than the first layer area.

15 Claims, 7 Drawing Sheets

LIGHT EMITTING DEVICE

CROSS-REFERENCE TO RELATED APPLICATIONS

The present application claims priority under 35 U.S.C. 126 and 35 U.S.C. 365 to Korean Patent Application No. 10-2007-0062914 (filed on Jun. 26, 2007), which is hereby incorporated by reference in its entirety.

BACKGROUND

A light emitting diode (LED) constitutes a light emitting source by using a compound semiconductor material such as GaAs series, AlGaAs series, CaN series, InGaN series, and InGaAlP series, etc. such that various colors can be realized.

Characteristics of the LED may be determined by materials a compound semiconductor, color and brightness, and a range of brightness intensity. Additionally, the LED is packaged and is applied to various fields such as lightening displays, character displays, and image displays.

Embodiments provide a light emitting device capable of mounting a light emitting device on each layer after forming a multilayered cavity in a package body.

Embodiments provide a light emitting device capable of mounting light emitting devices with respectively difference sizes and colors on each layer after forming a multilayered cavity in a package body.

An embodiment provides a light emitting device comprising: a package body comprising a multilayer cavity; a first light emitting part comprising a first light emitting device in a first cavity of a first layer area of the multilayer cavity; and a second light emitting part comprising a second light emitting device in a second cavity of a second layer area higher than the first layer area.

An embodiment provides a light emitting device comprising: a package body comprising a cavity of a multilayer area; a first light emitting part comprising a first light emitting device in a first layer area of the package body; and a second light emitting part comprising a second light emitting device smaller than the first light emitting device in a second layer area of the package body.

An embodiment provides a light emitting device comprising: a package body comprising a multilayer cavity; a first light emitting part comprising a first light emitting device and a first resin material in a first cavity of a first layer area of the multilayer cavity; and a second light emitting part comprising a second light emitting device and a second resin material in a second cavity of a second layer area higher than the first layer area, and emitting at least one light of a wavelength range different from that of the first light emitting part.

The details of one or more embodiments are set forth in the accompanying drawings and the description below. Other features will be apparent from the description and drawings, and from the claims.

DETAILED DESCRIPTION OF THE EMBODIMENTS

Hereinafter, embodiments will be described with reference to the accompanying drawings.

Figure 1:
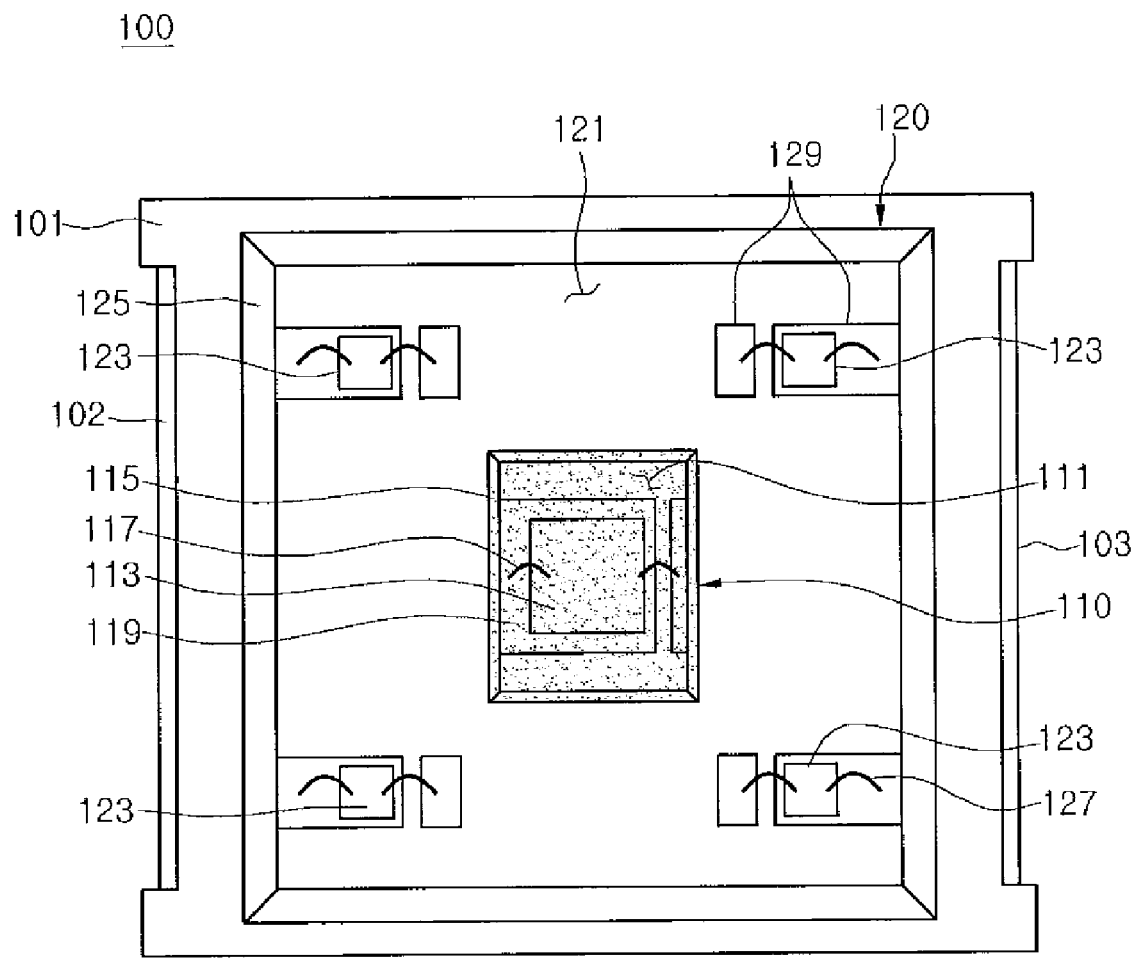
FIG. 1 is a plan view of a light emitting device according to a first embodiment.
Figure 2:
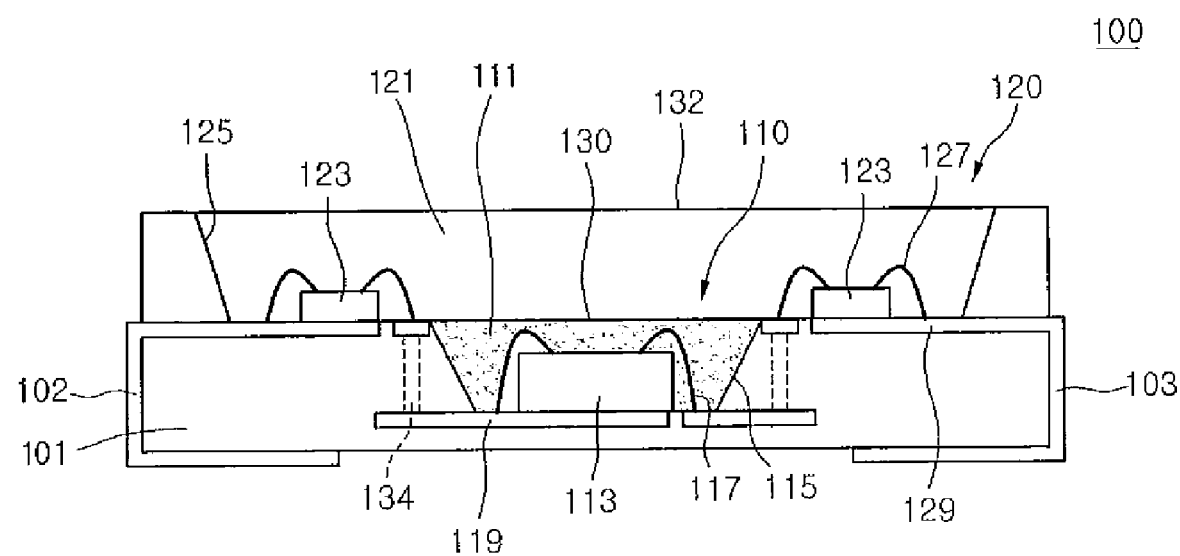
FIG. 2 is a cross-sectional view of FIG. 1.

FIG. 1 is a plan view of a light emitting device according to a first embodiment, FIG. 2 is a cross-sectional view of FIG. 1.

Referring to FIGS. 1 and 2, a light emitting device 100 comprises a package body 101, a first light emitting part 110 in an area of a first cavity 111, and a second light emitting part 120 in an area of a second cavity 121.

The package body 101 may be formed of one of a silicon material, a ceramic material, and a resin material (for example, silicon, silicon carbide (SiC), aluminum nitride (AlN), poly phthal amide (PPA), and liquid crystal polymer (LCP)) and also is not limited thereto.

A multilayered cavity 111 and 121 is formed in the package body 101. Here, the first cavity 111 is formed in the lowest first layer with respect to the top surface of the package body 101, and the second cavity 121 is formed in a second layer higher than the first cavity. The first cavity 111 may be formed with a step form in a predetermined area such as the middle or the edge of the second cavity 121. Positions and areas of the first cavity 111 and the second cavity 121 may respectively vary, and are not limited the above.

The first cavity 111 is formed with the thickness that is greater than a half of the thickness of the package body 101 and the depth of the minimum 150±5 μm.

The sides 115 and 125 of the first cavity 111 and the second cavity 121 are inclined toward the outer at a predetermined angle (e.g., 91° to 160°), and a reflective material may be coated thereon.

The first cavity 111 is used as a first light emitting part 110, and the second cavity 121 is used as a second light emitting part 120. That is, the first light emitting part 110 may be formed on a predetermined position (e.g., the middle area) of the second light emitting part 120.

A first electrode pad 119 is formed in the first cavity 111, and a second electrode pad 129 is formed in the second cavity 121. A plurality of the first electrode pad 119 is formed to be electrically open on the bottom of the first cavity 111, and a plurality of second electrode pads 129 is formed to be electrically open on the bottom of the second cavity 121. Additionally, a circuit structure of the first electrode pad 119 and the second electrode pad 129 may vary according to driving methods or electrode patterns, but is not limited thereto.

Electrode terminals 102 and 103, electrically connected to the first and second electrode pads 119 and 129, may be formed on the outer side of the package body 101. The number of the electrode terminals 102 and 103 may vary according to driving methods, and is not limited thereto. Here, the electrode pads 119 and 129 may be realized with a lead frame type or a gold plate pad type, and are not limited thereto.

Additionally, as illustrated in FIG. 2, a via hole 134 is formed in the package body 101 to electrically connect the electrode pads 119 and 129 of the first and second cavities 111 and 121.

A first light emitting device 113 is formed on the first electrode pad 119 of the first cavity 111, and a second light emitting device 123 is formed on the second electrode pad 129 of the second cavity 121. Accordingly, an area of the first cavity 111 can be also defined as the first light emitting part 111 and an area of the second cavity 121 can be also defined as the second light emitting part 120.

Here, the first light emitting device 113 and the second light emitting device 123 may use a III-V group compound semiconductor material such as GaAs, AlGaAs, GaN, InGaN and AlGaInP, or may be selected from a blue light emitting device (LED) chip, a green LED chip, a yellow LED chip, a red LED chip, and an ultra violet (UV) LED chip, and are not limited thereto.

The first light emitting device 113 is electrically connected to one of a pair of the first electrode pads 119 through a wire 117, and the second light emitting device 123 is electrically connected to one of a pair of the second electrode pads 129 through a wire 127. Here, the first and second light emitting devices 113 and 123 are connected to the electrode pads 119 and 129, respectively, but may vary according to a parallel semiconductor light emitting device or a vertical semiconductor light emitting device. Additionally, the first and second light emitting devices 113 and 123 are connected the electrode pads 119 and 129 using a flip method.

The size of the first light emitting device 113 may be different from that of the second light emitting device 123. For example, the first light emitting device 113 may be formed with a size that is more than two times that of the second light emitting device 123. That is, the first light emitting device 113 may be formed with a relatively large size.

Light emitted from the first and second light emitting devices 113 and 123 may be the same. For example, the first and second light emitting device 113 and 123 may be a blue LED chip, and are not limited thereto.

Additionally, the first and second light emitting devices 113 and 123 may be mounted using the same method or different methods. For example, the first light emitting device 113 may be mounted using a flip method and the second light emitting device 123 may be mounted using a wire method. The mounting method is not limited to the above.

The number of the first light emitting devices 113 formed in the first cavity 111 is different from the number of second light emitting devices 123 formed in the second cavity 121. There may be at least one first light emitting device 113 and there is a plurality of the second light emitting device 123 at respectively different positions. The number of light emitting devices is not limited to the above.

A first resin material 130 may be formed in the first cavity 111 and a second resin material 132 may be formed in the second cavity 121. The first and second resin materials 130 and 132 comprise transparent silicon or epoxy. A fluorescent material may be added to one of the first and second resin materials 130 and 132. The fluorescence material comprises at least one of a red fluorescence material, a blue fluorescence material, a green fluorescence material, and a yellow fluorescence material.

Here, in relation to manufacturing processes of the light emitting device 100, the first and second cavities 111 and 121 having a predetermined depth are formed in the package body 101. The first and second electrode 119 and 129 are exposed to be electrically open.

The first light emitting device 113 is mounted on the first electrode pad 119 of the first cavity 111, and the second light emitting device 123 is mounted on the second electrode pad 129 of the second cavity 121. A plurality of electrode terminals 102 and 103 are prepared at the outer of the package body 101, and the number of the electrode terminal 102 and 103 may vary according to internal circuit patterns.

Next, the first resin material 130 is filled in the first cavity 111 for hardening, and the second resin material 132 is filled in the second cavity 121 for hardening. Here, a yellow fluorescence material may be added to the first resin material 130. Accordingly, the light emitting device package is completed.

Additionally, a convex lens or a flat Fresnel lens is attached on the package body 101, in order to change pointing characteristics of emitting light. The lens may be integrated into the surface of the second resin material 132.

On the other hand, the first light emitting part 110 emits a white light at the center of the package body 101 through the first cavity 111. If the first light emitting device 113 is a blue LED chip, a yellow fluorescence material may be added to the first resin material 130 and the blue light and yellow light may be mixed and emitted as a white light. Additionally, if the first light emitting device 113 is an UV LED, a red fluorescence material, a blue fluorescence material, and a green fluorescence material may be added to the first resin material 130. Additionally, the first light emitting device 113 may emit a white light by using a three color LED chip.

On the other hand, the second light emitting part 120 emits a blue light at the second cavity 121. If the second light emitting device 123 is a blue LED chip, an additional fluorescence material is not added to the second resin material 132. The second light emitting device 123 may be formed at each corner or the middle of each side of the second cavity 121.

The size of the first light emitting device 113 of the first light emitting part 110 may be different from that of the second light emitting device 123 of the second light emitting part 120. For example, one side length of the first light emitting device 113 may be two times that of the second light emitting device 123. The first light emitting device 113 may be disposed with the size that is the sum of sizes of a plurality of second light emitting devices 123. For example, when the four second light emitting devices 123 are disposed, the size of the first light emitting device 113 may be four times that of the one second light emitting device 123.

A color temperature of a white light emitted from the first light emitting part 110 may be adjusted by a blue light emitted from the second light emitting part 120. Here, a color temperature can be controlled depending on the number of the driven second light emitting devices 123 in the second light emitting part 120.

Additionally, a yellow fluorescence material may be added to the second resin material 132 of the second light emitting part 120. Accordingly, light intensity of a white light emitted from the first and second light emitting parts 110 and 120 can be increased.

A protection device such as shottky diode and zener diode may be formed in the package body 101 in order to protect the light emitting devices 113 and 123 mounted on each layer area.

Figure 3:
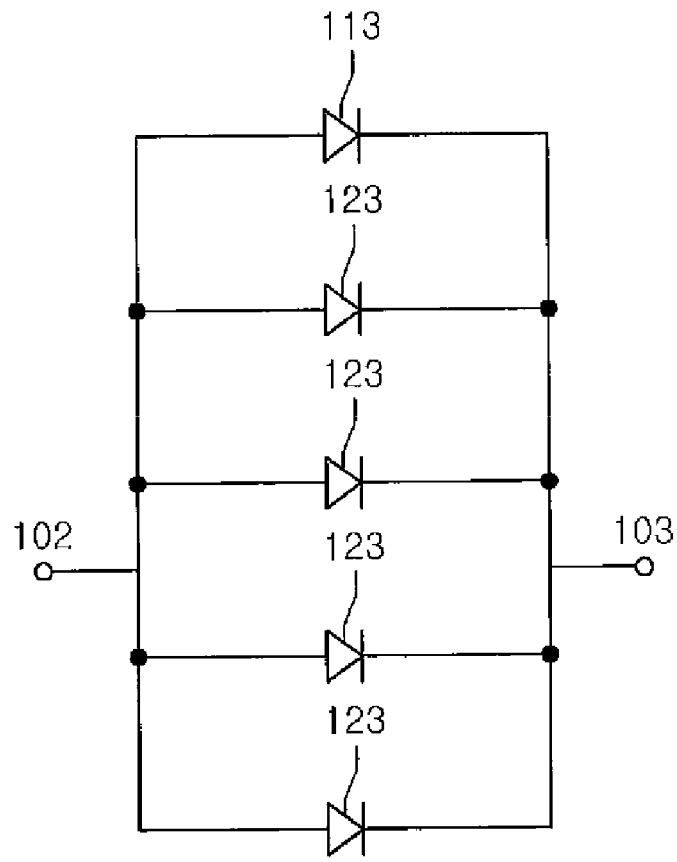
FIG. 3 is a view illustrating a first driving circuit of a light emitting device of FIG. 1.

FIG. 3 is a view illustrating a first driving circuit of a light emitting device of FIG. 1.

Referring to FIG. 3, light emitting devices 113 and 123 are commonly connected to two electrode terminals 102 and 103. That is, all the light emitting devices 113 and 123 can be simultaneously driven by using the two electrode terminals 102 and 103.

Figure 4:
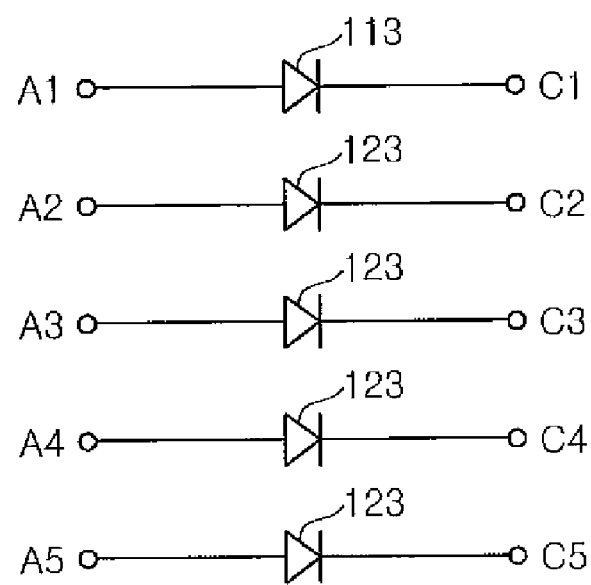
FIG. 4 is a view illustrating a second driving circuit of a light emitting device of FIG. 1.

FIG. 4 is a view illustrating a second driving circuit of a light emitting device of FIG. 1.

Referring to FIG. 4, five light emitting devices 113 to 123 can be separately driven by using five anode electrode terminals A1 to A5 and five cathode electrode terminals C1 to C5.

This circuit structure can drive all the second light emitting devices 123 or one by one incrementally after driving the first light emitting device 113. Color rendering of the light emitting device can be improved and a color temperature can be adjusted.

Figure 5:
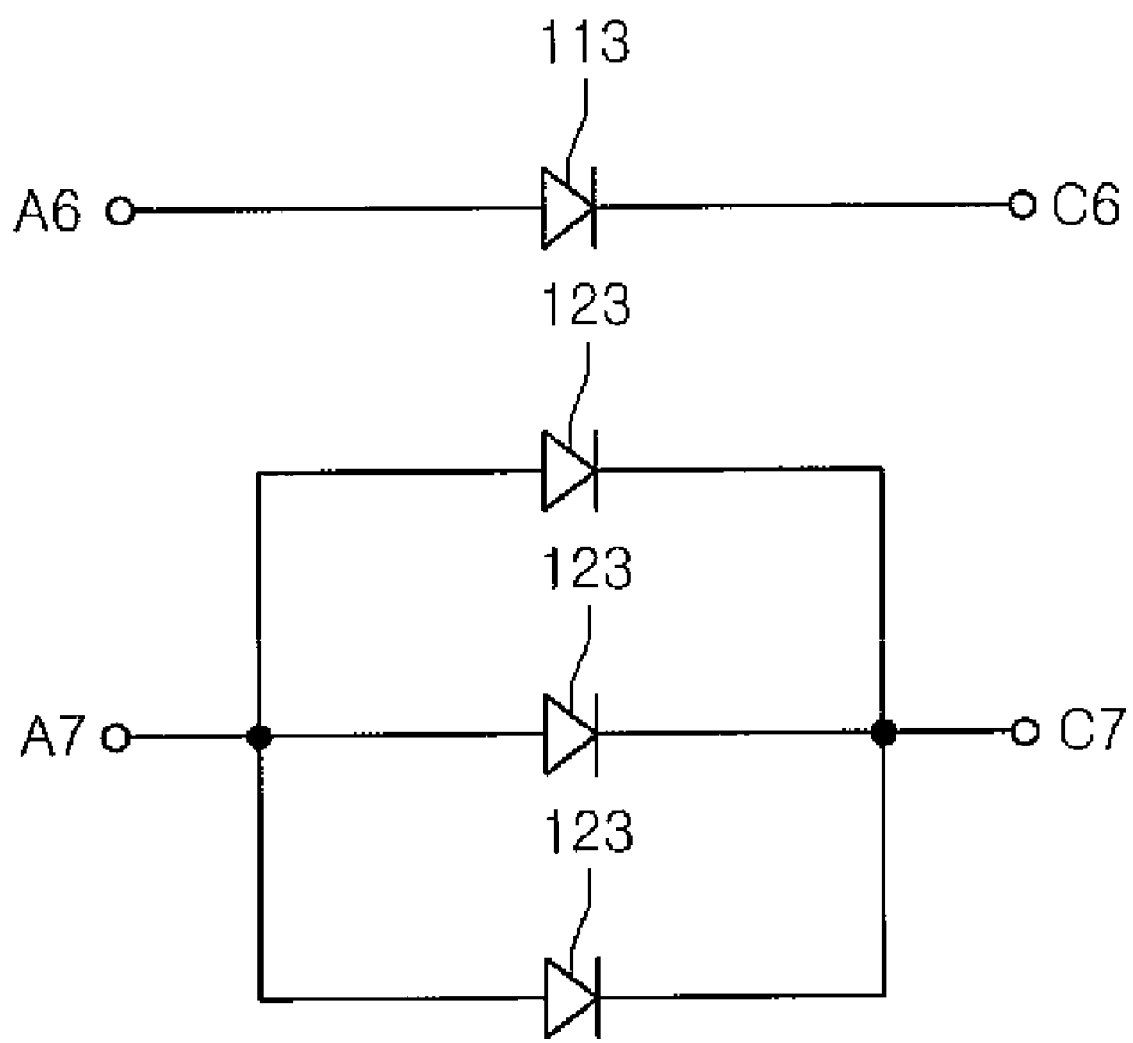
FIG. 5 is a view illustrating a third driving circuit of a light emitting device of FIG. 1.

FIG. 5 is a view illustrating a third driving circuit of a light emitting device of FIG. 1.

Referring to FIG. 5, the first light emitting device 113 is connected to two electrode terminals A6 and C6, and a plurality of second light emitting devices 123 is commonly connected to two electrode terminals A7 and C7. That is, the first light emitting device 113 and the second light emitting device 123 can be separately controlled.

As mentioned above, the first embodiment may comprise two to ten electrode terminals according to driving methods of the first and second light emitting devices 113 and 123, and is not limited to the driving circuits of FIGS. 3 to 5.

Figure 6:
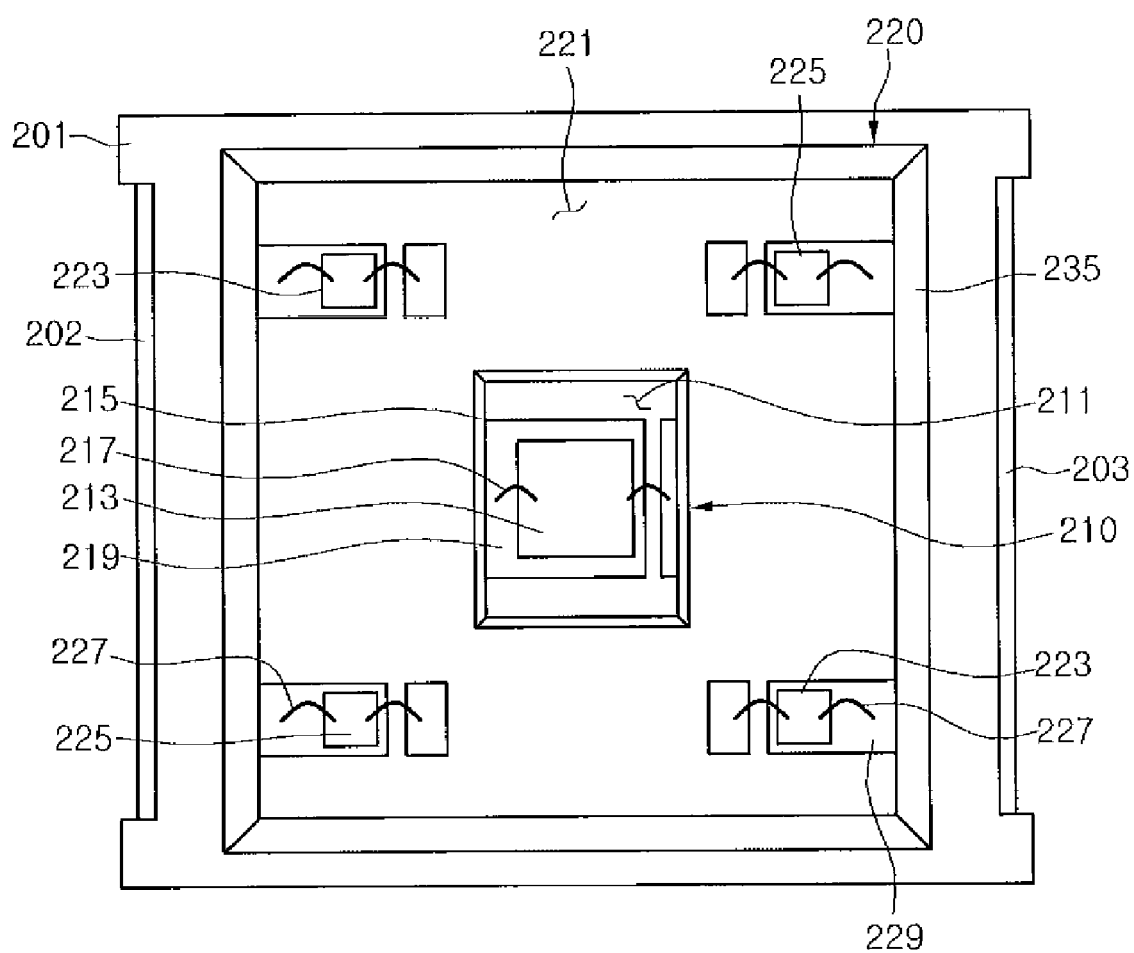
FIG. 6 is a plan view of a light emitting device according to a second embodiment.

FIG. 6 is a plan view of a light emitting device according to a second embodiment. An overlapping description in the first and second embodiments will be omitted for conciseness.

Referring to FIG. 6, the light emitting device 200 comprises a package body 201, a first light emitting part 210 in an area of a first cavity 211, and a second light emitting part 220 in an area of a second cavity 221.

The first light emitting part 210 is formed at the first cavity 211 of the package body 201, and the first light emitting device 213 disposed in the first cavity 211 may be formed of a green LED chip.

The second light emitting part 220 is formed at the second cavity 221 of the package body 201, and the second light emitting devices 223 and 225 disposed in the second cavity 221 may be formed of a plurality of red LED chips 223 and blue LED chips 225.

The red LED chips 223 may be diagonally disposed to face each other and the blue LED chips 225 may be diagonally disposed to face each other. The arrangement positions of the LED chips 223 and 225 may vary in order to improve light efficiency.

A first resin material (not shown) is formed in the first cavity 211 and a second resin material (not shown) is formed in the second cavity 221. An additional fluorescent material may not be added to the first and second resin materials.

The green LED chip (i.e., the first light emitting device 213) may have the size that is more than two times that of the red LED chip (i.e., the second light emitting devices 223) or the blue LED chips (i.e., the second light emitting devices 225).

Additionally, the green LED chip 213 may be formed with the size proportional to the sum of sizes of the red LED chip 223 or/and the blue LED chip 225. Moreover, the size of the green LED chip 213 may be formed with the size less than the sum of sizes of the second light emitting devices 223 and 225.

A plurality of electrode terminals 202 and 203 may be formed on the outer side of the package body 201 according to a structure of the electrode pads 219 and 229.

By driving the first light emitting device 213 of the first light emitting part 210 and the second light emitting devices 223 and 225 of the second light emitting part 220, a white light may be emitted. At this point, a relatively large size of the green LED chip is driven and the red LED chip or/and the blue LED chip is/are selectively driven, such that a color temperature and color coordinates can be adjusted.

Figure 7:
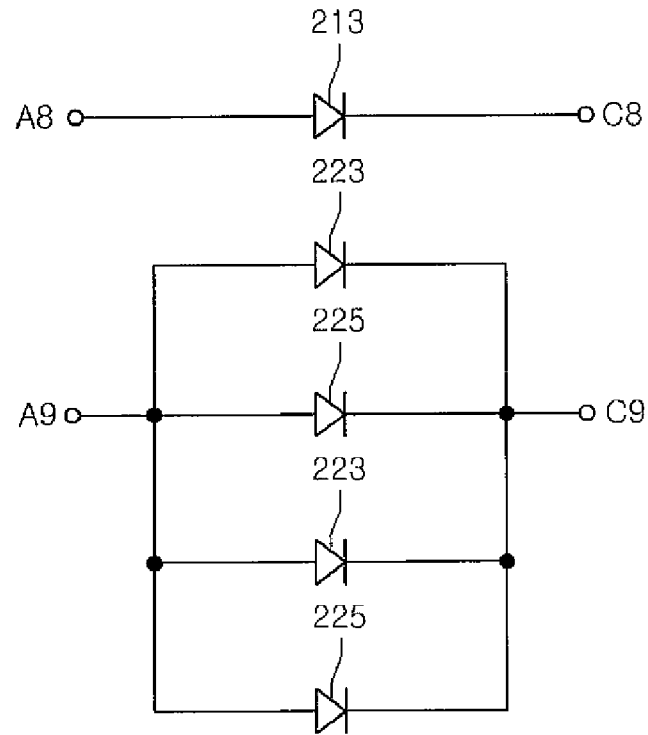
FIG. 7 is a first driving circuit of a light emitting device of FIG. 6.

FIG. 7 is a first driving circuit of a light emitting device of FIG. 6.

Referring to FIG. 7, the green LED chip (i.e., the first light emitting device 213) is connected to two electrode terminals A8 and C8, and also the red LED chip (i.e., the second light emitting device 223) and the blue LED chip (i.e., the second light emitting device 225) are commonly connected to two electrode terminals A9 and C9. By driving the green LED chip 213 and the red LED chip 223 and the blue LED chip 225, a color temperature and color coordinates can be adjusted.

Figure 8:
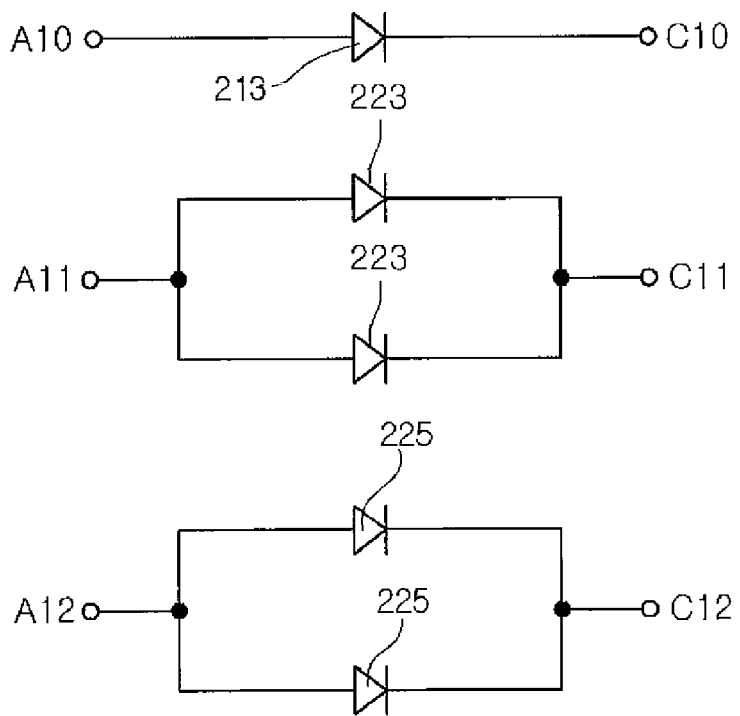
FIG. 8 is a view illustrating a second driving circuit of a light emitting device of FIG. 6.

FIG. 8 is a view illustrating a second driving circuit of a light emitting device of FIG. 6.

Referring to FIG. 8, the green LED chip 213 of the first light emitting device is connected to two electrode terminals A10 and C10, the red LED chip 213 of the second light emitting device is connected to two electrodes terminal A11 and C11, and the blue LED chip 225 of the second light emitting device is connected to two electrode terminals A12 and C12. That is, each of the color LED chips 213, 223, and 225 is connected to two electrode terminals such that it is possible to drive each of the color LED chip 213, 223, and 225 separately.

According to the second embodiment, each LED chip, each color of the LED chip, each layer can be driven independently according to the driving method of the LED chips.

Figure 9:
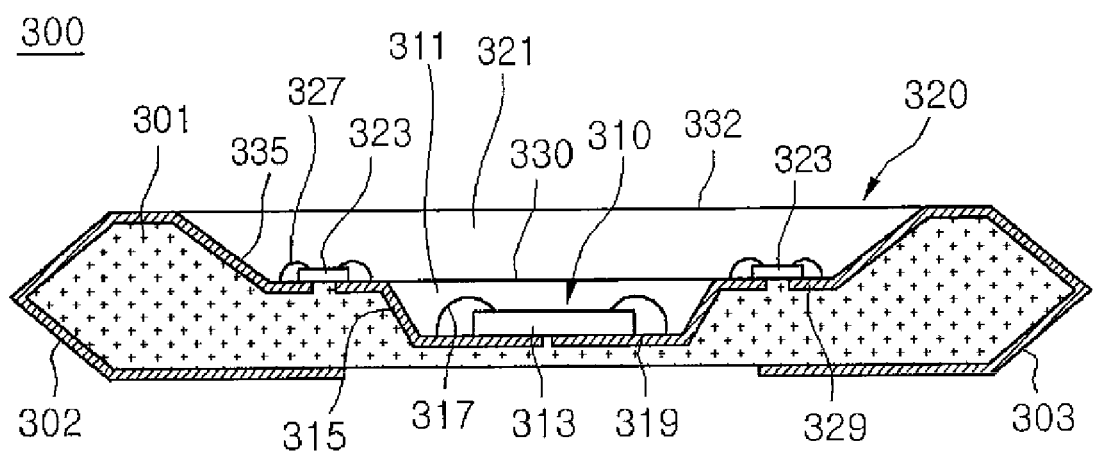
FIG. 9 is a cross-section view of a light emitting device according to a third embodiment.

FIG. 9 is a cross-section view of a light emitting device according to a third embodiment.

Referring to FIG. 9, a light emitting device 300 comprises a package body 301, a first light emitting part 310 in an area of a first cavity 311, and a second light emitting part 320 in an area of a second cavity 321.

The first cavity 311 and the second cavity 321 are formed in the package body 301, and the first cavity 311 is formed at the middle of the second cavity 321. Coated electrode pads 319 and 329 are formed on the side 315 of the first cavity 311 and the side 325 of the second cavity 321, respectively. The electrode pads 319 and 329 are formed on the top, the outer side, and the bottom of the package body 301 and also the surface of the cavities 311 and 321, such that at least two electrode terminals 302 and 303 are formed.

The first light emitting device 313 and the first resin material 330 are formed in the first cavity 311, and a plurality of second light emitting devices 323 and second resin materials 332 are formed in the second cavity 321. The first and second light emitting devices 313 and 323 may be connected through wires 317 and 327, but are not limited thereto.

The size and kinds of emitting lights of the first light emitting device 313 and the second light emitting device 323 may vary according to a target light. Additionally, kinds of fluorescent materials added to the first resin material 330 and the second resin material 332 may vary according to the target light.

The structure of the first and second light emitting devices 313 and 323 and the first and second resin materials 330 and 332 of the third embodiment may adapt components of the first embodiment or/and the second embodiment but is not limited thereto.

The above mentioned embodiments provide diodes, which can drive each of a white light and three color light separately, to one package, such that the diodes can be used as a flash light source of a mobile terminal.

Furthermore, it is possible to provide a package that selectively emitting a white light and another color light. Moreover, when a white light is emitted, color rendering and brightness can be improved compared to a related art package by driving white and three color light emitting diodes simultaneously. Furthermore, it is used as a package for indication by using multi color light source.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a package body comprising a first cavity and a second cavity, the first cavity being disposed on a lower portion of the second cavity;
   a first light emitting part comprising a first light emitting diode chip on the first cavity; and
   a second light emitting part comprising a plurality of second light emitting diode chips on the second cavity,
   wherein a first electrode pad having a first conductive pad and a second electrode conductive pad, the first electrode pad is disposed in the package body and a top surface of the first electrode pad is planar with a bottom surface of the first cavity, and second electrode pad having a first conductive pad and a second conductive pad, the second electrode pad is disposed in the package body and a top surface of the second electrode pad is planar with a bottom surface of the second cavity,
   wherein the package body includes a first via hole physically connected to the first conductive pad of the first electrode pad and the first conductive pad of the second electrode pad and a second via hole physically connected to the second electrode conductive pad of the first electrode pad and the second conductive pad of the second electrode pad.

2. The light emitting device according to claim 1, wherein the first light emitting diode chip of the first light emitting part has a different size than each of the second light emitting diode chips of the second light emitting part.

3. The light emitting device according to claim 1, wherein the first cavity is disposed at a middle area of the second cavity, and the plurality of second light emitting diode chips are disposed with a substantially same interval from the first cavity.

4. The light emitting device according to claim 1, wherein the first light emitting diode chip has a size that is more than two times that of each of the second light emitting diode chips.

5. The light emitting device according to claim 1, wherein the first light emitting diode chip has a size that is less than a sum of sizes of the second light emitting diode chips and greater than a size of one of the second light emitting diode chips.

6. The light emitting device according to claim 1, wherein the first light emitting part comprises a first resin material including a fluorescent material in the first cavity.

7. The light emitting device according to claim 1, wherein the first light emitting part emits a white light, the second light emitting part comprises a blue light emitting diode chip and a second resin material in the second cavity.

8. The light emitting device according to claim 1, wherein the first cavity has a depth that is a half of the package body or a depth of 150±5 μm from a top of the package body.

9. A light emitting device comprising:
   a package body comprising a first cavity and a second cavity, the first cavity being disposed on a lower portion of the second cavity;
   a first light emitting part comprising a first light emitting diode chip on the first cavity;
   a second light emitting part comprising a plurality of second light emitting diode chips on the second cavity, each of the second light emitting diode chips formed in a size smaller than that of the first light emitting diode chip; and
   a first electrode pad having a first conductive pad and a second electrode conductive pad, the first electrode pad is disposed in the package body and a top surface of the first electrode pad is planar with a bottom surface of the first cavity, and second electrode pad having a first conductive pad and a second conductive pad, the second electrode pad is disposed in the package body and a top surface of the second electrode pad is planar with a bottom surface of the second cavity,
   wherein the package body includes a first via hole physically connected to the first conductive pad of the first electrode pad and the first conductive pad of the second electrode pad and a second via hole physically connected to the second electrode conductive pad of the first electrode pad and the second conductive pad of the second electrode pad.

10. The light emitting device according to claim 9, wherein sides of the first cavity and the second cavity are slanted with respect to bottom surfaces of the first cavity and the second cavity.

11. The light emitting device according to claim 9, wherein the first light emitting part is disposed at a middle of the second cavity and the second cavity includes a first resin material including a fluorescent material therein.

12. A light emitting device comprising:
   a frame comprising a first cavity and a second cavity;
   a first light emitting diode chip in the first cavity;
   a second light emitting diode chip on the second cavity; and
   a first electrode pad having a first conductive pad and a second electrode conductive pad, the first electrode pad is disposed in the package body to connect the first light emitting diode chip, a to surface of the first electrode pad is planar with a bottom surface of the first cavity, and second electrode pad having a first conductive pad and a second conductive pad, the second electrode pad is disposed in the package body to connect the second light emitting diode chip, a top surface of the second electrode pad is planar with a bottom surface of the second cavity,
   wherein the second light emitting diode chip is in plurality, and the first light emitting diode chip is disposed on a center area of the plurality of the second light emitting diode chips,
   wherein the package body includes a first via hole physically connected to the first conductive pad of the first electrode pad and the first conductive pad of the second electrode pad and a second via hole physically connected to the second electrode conductive pad of the first electrode pad and the second conductive pad of the second electrode pad.

13. The light emitting device according to claim 12, wherein the first light emitting diode chip has a size that is more than two times that of each of the second light emitting diode chips.

14. The light emitting device according to claim 12, wherein the resin material includes a first resin material in the first cavity, the first resin material comprising a fluorescent material.

15. The light emitting device according to claim 12, wherein the plurality of the second light emitting diode chips are diagonally disposed to face each other.

* * * * *